(12) United States Patent
Lee

(10) Patent No.: US 6,172,910 B1
(45) Date of Patent: Jan. 9, 2001

(54) TEST CELL FOR ANALYZING A PROPERTY OF THE FLASH EEPROM CELL AND METHOD OF ANALYZING A PROPERTY OF THE FLASH EEPROM CELL USING THE SAME

(75) Inventor: Hee Youl Lee, Daejeon-Shi (KR)

(73) Assignee: Hyundai Electronics Industries Co., Ltd., Kyungki-Do (KR)

( * ) Notice: Under 35 U.S.C. 154(b), the term of this patent shall be extended for 0 days.

(21) Appl. No.: 08/984,902

(22) Filed: Dec. 4, 1997

(30) Foreign Application Priority Data

Dec. 4, 1996 (KR) .................................................. 96-61549

(51) Int. Cl.[7] .................................................. G11C 13/00
(52) U.S. Cl. ...................................... 365/185.22; 365/201
(58) Field of Search .............................. 365/201, 185.22, 365/185.1

(56) References Cited

U.S. PATENT DOCUMENTS 5,590,075  12/1996  Mazzali .

*Primary Examiner*—Terrell W. Fears
(74) *Attorney, Agent, or Firm*—Scott C. Harris, Esq

(57) ABSTRACT

The present invention disclosed the test cell and method of analyzing using the same which can analysis the cause of degradation of flash EEPROM cell in connection with programming, erasing or reading operation. The test cell comprises a first unit cell consisted of a drain, a source and a floating gate, a control gate; a second unit cell consisted of a drain, a source and a floating gate, control gate formed integrally with the floating gate and control gate of the first unit cell, respectively; and a third unit cell consisted of a drain, a source and a floating gate, a control gate formed integrally with the floating gate and control gate of the first unit cell, respectively.

12 Claims, 2 Drawing Sheets

TEST CELL FOR ANALYZING A PROPERTY OF THE FLASH EEPROM CELL AND METHOD OF ANALYZING A PROPERTY OF THE FLASH EEPROM CELL USING THE SAME

BACKGROUND OF THE INVENTION

1. Field of the Invention

The present invention relates to a test cell to analysis a property of the flash EEPROM cell and method of analyzing a property of flash EEPROM cell using same.

2. Description of the Prior Arts

Generally, the flash EEPROM cell is classified into a split gate type and stack gate type. It is desirable that the properties of the split gate type or stack gate type flash EEPROM cell are not changed although the operations of the programming and erasing are repeated and have excellent endurance property. However, the efficiency of the cell may be deteriorated by the repeating operations of the cell. In order to verify the properties of program/erase cycling endurance, a part of main chip cell is changed to a pattern so that the reliability of cell is verified by the pattern. However, the user does not know the degradation while user knows the degree of the degradation.

SUMMARY OF THE INVENTION

Accordingly, it is an object of the present invention to provide the test cell and method of analyzing using the same which can analysis the cause of degradation of flash EEPROM cell in connection with programming, erasing or reading operation.

The test cell according to the present invention comprises a first unit cell consisted of a drain, a source and a floating gate, a control gate; a second unit cell consisted of a drain, a source and a floating gate, control gate formed integrally with the floating gate and control gate of the first unit cell, respectively,; and a third unit cell consisted of a drain, a source and a floating gate, a control gate formed integrally with the floating gate and control gate of the first unit cell, respectively.

A method of analyzing a property of a flash EEPROM cell according to the invention first comprises the steps of; providing a test cell comprising a first unit cell consisted of a drain, a source and a floating gate, a control gate, a second unit cell consisted of a drain, a source and a floating gate, control gate formed integrally with the floating gate and control gate of the first unit cell, respectively, and a third unit cell consisted of a drain, a source and a floating gate, a control gate formed integrally with the floating gate and control gate of the first unit cell, respectively; erasing the first unit cell, whereby the unit cells are erased; reading the unit cells; programming the second unit cell, whereby said unit cells are programmed; reading the unit cells; and performing repeatedly the erasing, reading, programming reading steps as many as predetermined cycles, thereby comparing the unit cells having differ properties, respectively and grasping the cause of lowering the properties.

BRIEF DESCRIPTION OF THE DRAWINGS

Other objects and advantages of the present invention will be understood by reading the detailed explanation of the embodiment with reference to the accompanying drawings in which.

Below, the present invention will be described in detail with reference to the accompanying drawings.

DETAILED DESCRIPTION OF THE EMBODIMENTS

Figure 1:
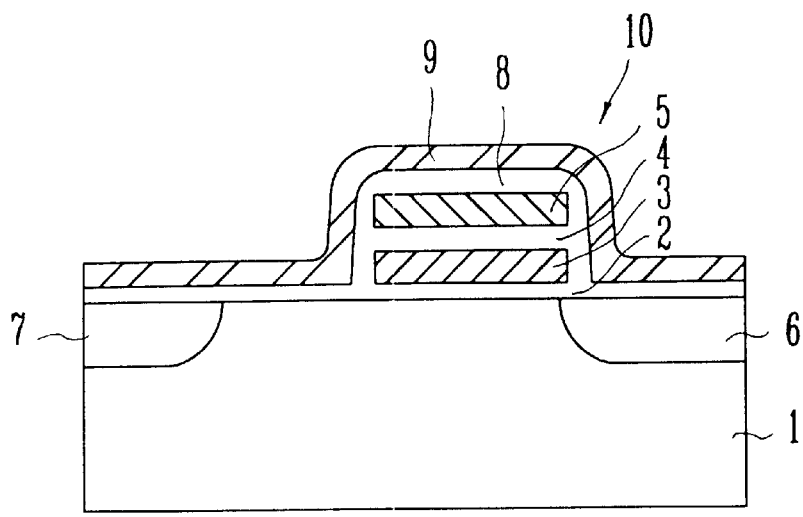
FIG. 1 is a sectional view of a conventional split gate type flash EEPROM cell.

FIG. 1 is a sectional view of the split gate type flash EEPROM cell. In the split gate type flash EEPROM cell, a tunnel oxide film 2 is formed on a silicon substrate 1 and a floating gate 3 is formed on the tunnel oxide film 2. A dielectric film 4, on which a control gate 5 is formed, is formed on the floating gate 3. A drain 6, which is overlapped to a portion of the control gate 3, is formed on the silicon substrate 1, and a drain 7, which is spaced from the another portion of the control gate 3, is formed on the silicon substrate 1. A word line is formed on an insulating film 8 formed on the entire structure including the control gate 5, the drain and source 6 and 7.

Figure 2:
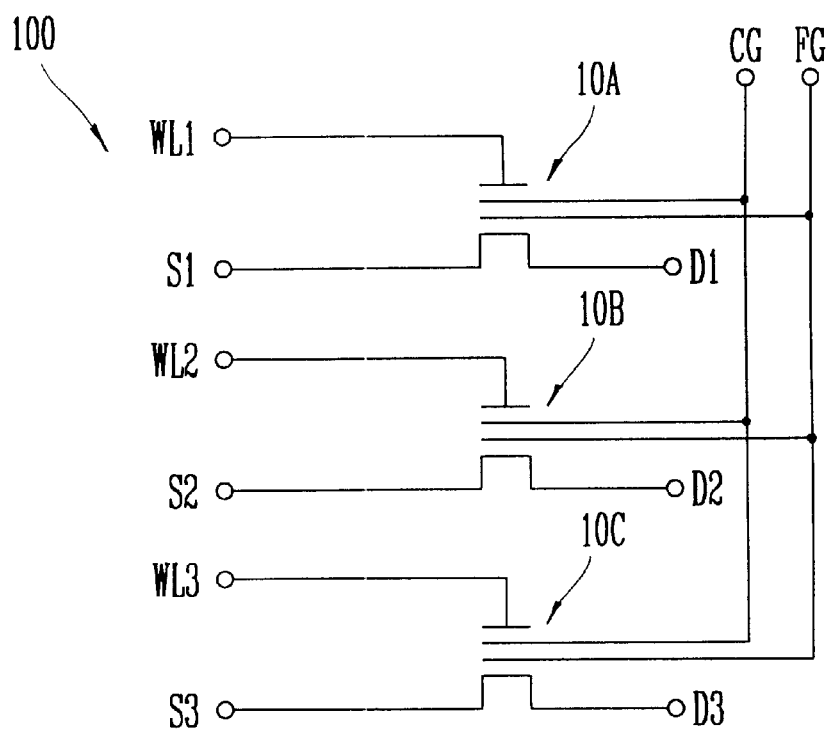
FIG. 2 shows a test cell of the first embodiment of the present invention.

FIG. 2 shows a test cell of the first embodiment of the present invention.

A test cell 100 according to the first embodiment is consisted of a first unit cell 10A, a second unit cell 10B and a third unit cell 10C which are the split gate type flash EEPROM cell as shown in FIG. 1, respectively.

A floating gate FG acts as a floating gate of the first, second and third unit cells 10A, 10B and 10C, in commnon, and a control gate CG acts as a control gate of the first, second and third unit cells 10A, 10B and 10C, in common. A source, drain and a word line are formed in each of the first, second and third unit cells 10A, 10B and 10C, respectively. Therefore, a program, erase and read operations are performed in each unit cell.

In the test cell 100 as described above, one unit cell of the first, second and third unit cells 10A, 10B and 10C is only programmed, another one unit cell is erased, and all of the unit cells are read so that properties of the unit cells are confirmed and compared to each other for finding causes of degradation of the property of the cell.

The operations of the test cell 100 is performed in the order of erase-read-program-read operations according to the program and erase method of the split gate type flash EEPROM cell.

1. Erase Operation.

Voltage of 0V is applied to the silicon substrate, voltage of −12V is applied to the control gate CG, voltages 0V and 5V are applied to the word line WL1 and the drain D1 of the first unit cell 10A, respectively. And, the source S1 of the first unit cell 10A and the other terminals of the second and third unit cells 10B and 10C are in float. Therefore, electrons stored in the floating gate FG are discharged to the drain of the first unit cell 10A so that only the first unit cell 10A receives a stress generated during the erase operation. Consequently, although the second and third unit cells 10B and 10C do not receive the stress, the first, second and third unit cells 10A, 10B and 10C are erased.

2. Read Operation.

Voltage of 3.8V is applied to the control gate CG, voltages 5V, 2V and 0V are applied to the word line WL1, source and the drain D1 of the first unit cell 10A, respectively. And, all terminals of the second and third unit cells 10B and 10C are in float so that the first unit cell 10A is read. Thereinafter, the second and third unit cells 10B and 10C are read substantially by method which is same as method for reading the first unit cell 10A so that the properties of the unit cells 10A, 10B and 10C are grasped.

3. Program Operation.

Voltage of 13V is applied to the control gate CG, voltages 1.8V, 0V and 5V are applied to the word line WL2, source S2 and drain D2 of the second unit cell 10B, respectively. And, the terminals of the first and third unit cells 10A and 10C are in float. Therefore, electrons stored in substrate are charged to the floating gate FG so that the only second unit cell 10B receives a stress generated during the program operation. Consequently, although the first and third unit cells 10A and 10C do not receive the stress, the first, second and third unit cells 10A, 10B and 10C are programmed.

4. Read Operation.

The first, second and third unit cells 10A, 10B and 10C are read again by the method which is same as the method of reading the first, second and third unit cells 10A, 10B and 10C.

For grasping the properties of the first, second and third unit cells 10A, 10B and 10C, the erase-read-program-road operations are performed repeatedly as many as predetermined cycles (target cycles). Therefore, the first unit cell 10A which is erased and read, the second unit cell 10B which is programmed and read and the third unit cell 10C, which is only read, will be have distinct properties, respectively. It is possible to analysis a change of endurance of each unit cell according to the erase, program and read operations by comparing the properties of the unit cells.

Figure 3:
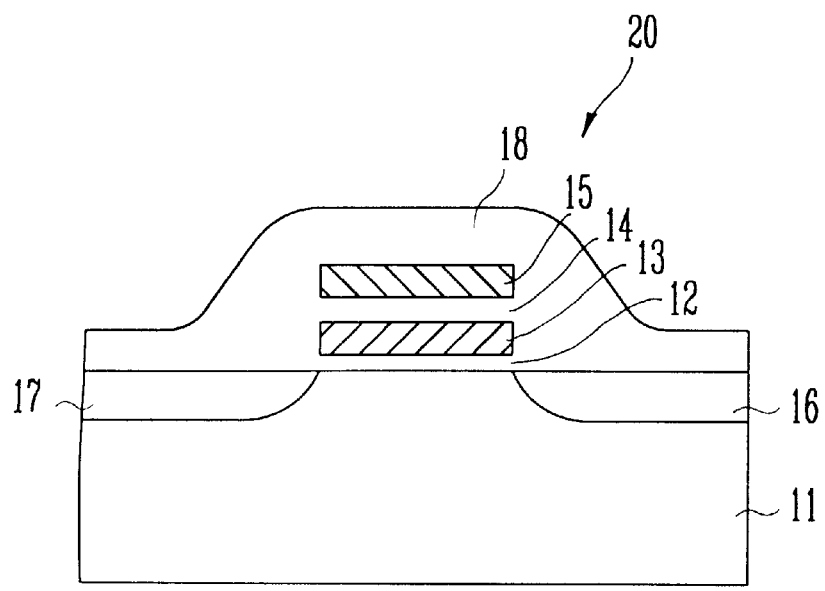
FIG. 3 is a sectional view of a conventional stack type flash EEPROM cell.

FIG. 3 is a sectional view of the stack gate type flash EEPROM cell. In the stack gate type flash EEPROM cell, a tunnel oxide film 12 is formed on a silicon substrate 11 and a floating gate 13 is formed on the tunnel oxide film 12. A dielectric film 14, on which a control gate 15 is formed, is on the floating gate 13. Drain and source 16 and 17 overlapped with both side of the floating gate 13 are formed on the silicon substrate 11. An insulating film 18 is formed on the entire structure including the control gate 15, the drain and source 16 and 17.

Figure 4:
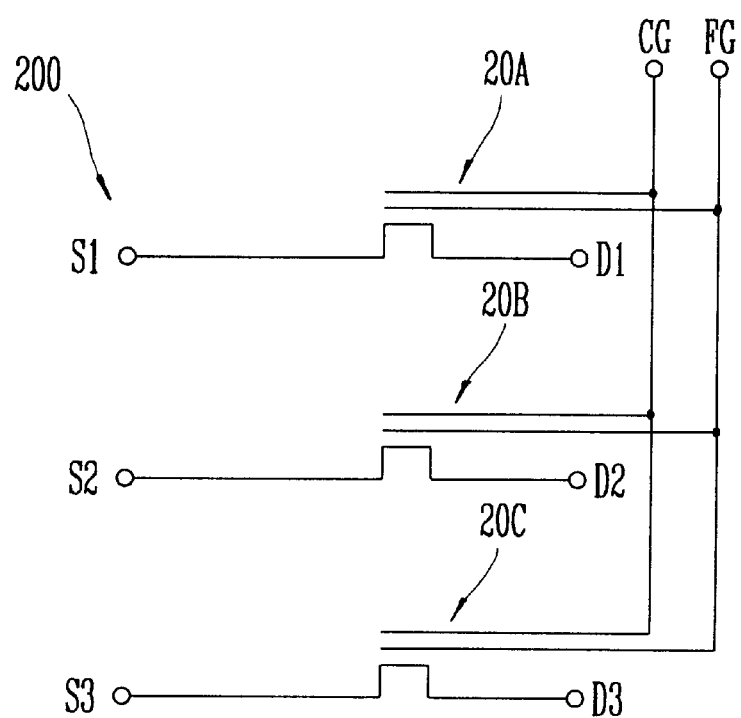
FIG. 4 shows a test cell of the second embodiment of the present invention.

FIG. 4 shows a test cell of the second embodiment of the present invention. A test cell 200 according to the second embodiment is consisted of a first unit cell 20A, a second unit cell 20B and a third unit cell 20C which are the stack gate type flash EEPROM cell as shown in FIG. 3, respectively.

A floating gate FG acts as a floating gate of the first, second and third unit cells 20A, 20B and 20C, in common, and a control gate CG acts as a control gate of the first, second and third unit cells 20A, 20B and 20C, in common. A source and drain are formed in each of the first, second and third unit cells 20A, 20B and 20C, respectively. Therefore, a program, erase and read operations are performed in each unit cell.

In the test cell 200 as described above, one unit cell of the first, second and third unit cells 20A, 20B and 20C is only programmed, another one unit cell is erased, and all of the unit cells are read so that properties of the unit cells are confirmed and compared to each other for finding causes of degradation of the property of the cell.

In general, method of programming, erasing and reading a stack gate flash EEPROM cell is classified into as follows;

I. Drain side hot electron injecting method for programming and source folwer-nordheim tunneling method for erasing;

II. Drain side hot electron injecting method for programming and channel folwer-nordheim tunneling method for erasing; and III. Channel folwer-nordheim tunneling method for programming and erasing.

The operations of the test cell 200 is performed in the order of erase-read-program-read operations according to the program and erase method of the stack gate type flash EEPROM cell.

I. In case of using a drain side hot electron injecting method for programming and source folwer-nordheim tunneling method for erasing;

1. Erase Operation.

Voltages of 0V and −12V are applied to the silicon substrate and the control gate CG, respectively, voltage 5V is applied to the source S1 of the first unit cell 20A. And, the drain D1 of the first unit cell 20A and the other terminals of the second and third unit cells 20B and 20C are in float. Therefore, only the first unit cell 20A receives a stress generated during the erase operation. Consequently, although the second and third unit cells 20B and 20C do not receive the stress, the first, second and third unit cells 20A, 20B and 20C are erased.

2. Read Operation.

Voltage of Vcc, 0V, 1.5V and 0V are applied to the control gate CG, the source S1, drain D1 of the first unit cell 20A and the silicon substrate, respectively. And, all terminals of the second and third unit cells 20B and 20C are in float so that the first unit cell 20A is read. Thereinafter, the second and third unit cells 20B and 20C are read substantially by method which is same as method for reading the first unit cell 20A so that the properties of the unit cells 20A, 20B and 20C are grasped.

3. Program Operation.

Voltages of 13V and 0V are applied to the control gate CG and the silicon substrate, respectively, and voltages 0V and 5V are applied to the source S2 and drain D2 of the second unit cell 20B, respectively. And, the terminals of the first and third unit cells 20A and 20c are in float. The only second unit cell 20B receives a stress generated during the program operation. Consequently, although the first and third unit cells 20A and 20C do not receive the stress, the first, second and third unit cells 20A, 20B and 20C are programmed.

4. Read Operation.

The first, second and third unit cells 20A, 20B and 20C are read again By the method which is same as the method of reading the first, second and third unit cells 20A, 20B and 20C as described above II. In case of using drain side hot electron injecting method for programming and channel folwer-nordheim tunneling method for erasing;

1. Erase Operation.

Negative bias voltage is applied to the control gate CG and Vss or positive bias voltage is applied to the silicon substrate. All terminals of the first, second and third unit cells 20A, 20B and 20C are in float. Therefore, only the first unit cell 20A receives a stress generated during the erase operation. Consequently, although the second and third unit cells 20B and 20C do not receive the stress, the first, second and third unit cells 20A, 20B and 20C are erased.

2. Read Operation.

Voltages of Vcc and 0V are applied to the control gate CG and the silicon substrate, respectively and voltages 0V and 1.5V are applied to the source S1 and drain D1 of the first unit cell 20A, respectively. And all terminals of the second and third unit cells 20B and 20C are in float so that the first unit cell 20A is read. Thereinafter, the second and third unit cells 20B and 20C are read substantially by method which is same as method for reading the first unit cell 20A so that the properties of the unit cells 20A, 20B and 20C are grasped.

3. Program Operation.

Voltages of 13V and 0V are applied to the control gate CG and the silicon substrate, respectively, and voltages 0V and 5V are applied to the source S2 and drain D2 of the second unit cell 20B, respectively. And, the terminals of the first and third unit cells 20A and 20C are in float. The only second unit cell 20B receives a stress generated during the program operation. Consequently, although the first and third unit cells 20A and 20C do not receive the stress, the first, second and third unit cells 20A, 20B and 20C are programmed.

4. Read Operation.

The first, second and third unit cells 20A, 20B and 20C are read again by the method which is same as the method of reading the first, second and third unit cells 20A, 20B and 20C as described above.

III. In case of using channel folwer-nordheim tunneling method for programming and erasing;

1. Erase Operation.

Negative bias voltage is applied to the control gate CG and Vss or positive bias voltage is applied to the silicon substrate. All terminals of the first, second and third unit cells 20A, 20B and 20C are in float. Therefore, only the first unit cell 20A receives a stress generated during the erase operation.

Consequently, although the second and third unit cells 20B and 20C do not receive the stress, the first, second and third unit cells 20A, 20B and 20C are erased.

2. Read Operation

Voltages of Vcc and 0V are applied to the control gate CG and the silicon substrate, respectively and voltages 0V and 1.5V are applied to the source S1 and drain D1 of the first unit cell 20A, respectively. And all terminals of the second and third unit cells 20B and 20C are in float so that the first unit cell 20A is read. Thereinafter, the second and third unit cells 20B and 20C are read substantially by method which is same as method for reading the first unit cell 20A so that the properties of the unit cells 20A, 20B and 20C are grasped.

3. Program Operation

Positive bias voltage is applied to the control gate CG, and Vss or negative voltage is applied to the silicon substrate. And the terminals of the first, second third unit cells 20A, 20B and 20C are in float. The only second unit cell 20B receives a stress generated during the program operation. Consequently, although the first and third unit cells 20A and 20C do not receive the stress, the first, second and third unit cells 20A, 20B and 20C are programmed.

4. Read Operation

The first, second and third unit cells 20A, 20B and 20C are read again by the method which is same as the method of reading the first, second and third unit cells 20A, 20B and 20C as described above.

For grasping the properties of the first, second and third unit cells 20A, 20B and 20C, the erase-read-program-read operations are performed repeatedly as many as target cycles. Therefore, the first unit cell 20A which is erased and read, the second unit cell 20B which is programmed and read and the third unit cell 20C, which is only read, will be have distinct properties, respectively. It is possible to analysis a change of endurance of each unit cell according to the erase, program and read operations by comparing the properties of the unit cells.

As described above, when the test cell according to the present invention is used, it is possible to find a cause of degradation of flash EEPROM cell in connection with programming, erasing or reading operation.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A test cell for analyzing a property of a flash EEPROM cell comprising;

a first split gate type unit cell having a first drain, a first source, a first word line, a first floating gate and a first control gate;

a second split gate type unit cell having a second drain, a second source, a second word line, a second floating gate and a second control gate and;

a third split gate type unit cell having a third drain, a third source, a third word line, a third floating gate and a third control gate, wherein said first, second and third control gates are connected to each other and said first, second and third floating gates are connected to each other.

2. A method of analyzing a property of a flash EEPROM cell, comprising the steps of:

(a) providing a test cell having a first split gate type unit cell having a first drain, a first source, a first word line, a first floating gate and a first control gate; a second split gate type unit cell having a second drain, a second source, a second word line, a second floating gate and a second control gate and; a third split gate type unit cell having a third drain, a third source, a third word line, a third floating gate and a third control gate, wherein said first, second and third control gates are connected to each other and said first, second and third floating gates are connected to each other;

(b) erasing said test cell so that only said first unit cell is affected by a stress;

(c) reading said first, second and third unit cells, respectively;

(d) programming said test cell so that only said second unit cell is affected by a stress;

(e) reading said first, second and third unit cells, respectively;

(f) repeatedly performing said steps (b), (c), (d) and (e); and (g) comparing a property of said first, second and third unit cells.

3. The method of claim 2, wherein said step (b) is performed in condition that voltages of 0V and 12V are applied to said first word line and said first control gate, voltages of 5V is applied to said first drain, and another terminals of said first, second and third unit cells are floated.

4. The method of claim 2, wherein said read operation of said first unit cell is performed in condition that voltage of 3.8V is applied to said first control gate, voltages of 5V, 2V and 0V are applied to said first word line, said first source and said first drain, and another terminals of said first, second and third unit cells are floated and said read operation of said second and third unit cells are performed in same condition as the condition for reading said first unit cell.

5. The method of claim 2, wherein said step (d) is performed in condition that voltage of 13V is applied to said second control gate, voltages of 1.8V, 0V and 5V are applied to said second word line, said second source and said second drain, and another terminals of said first, second and third unit cells are floated.

6. A test cell for analyzing a property of a flash EEPROM cell comprising:

a first stack gate type unit cell having a first drain, a first source, a first floating gate and a first control gate;

a second stack gate type unit cell having a second drain, a second source, a second floating gate and a second control gate and;

a third stack gate type unit cell having a third drain, a third source, a third floating gate and a third control gate, wherein said first, second and third control gates are connected to each other and said first, second and third floating gates are connected to each other.

7. A method of analyzing a property of a flash EEPROM cell, comprising the steps of:

(a) providing a test cell having a first stack gate type unit cell having a first drain, a first source, a first floating gate and a first control gate; a second stack gate type unit cell having a second drain, a second source, a second floating gate and a second control gate and; a third stack gate type unit cell having a third drain, a third source, a third floating gate and a third control gate, wherein said first, second and third control gates are connected to each other and said first, second and third floating gates are connected to each other;

(b) erasing said test cell so that only said first unit cell is affected by a stress;

(c) reading said first, second and third unit cells, respectively;

(d) programming said test cell so that only said second unit cell is affected by a stress;

(e) reading said first, second and third unit cells, respectively;

(f) repeatedly performing said steps (b), (c), (d) and (e); and (g) comparing a property of said first, second and third unit cells.

8. The method of claim 7, wherein said step (b) is performed in condition that voltage of −12V is applied to said first control gate, voltage of 5V is applied to said first source of said first unit cell, and another terminals of said first, second and third unit cells are floated.

9. The method of claim 7, wherein said read operation of said first unit ell is performed in condition that voltage of Vcc is applied to said first control gate, voltages of 0V and 1.5V are applied to said first source and said first drain of said first unit cell, and another terminals of said first, second and third unit cells are floated, and said read operation of said second and third unit cells are performed in same condition as the condition for reading said first unit cell.

10. The method of claim 7, wherein said program operation is performed in condition that voltage of 13V is applied to said second control gate, voltages of 0V and 5V are applied to said second source and said second drain of said second unit cell, and another terminals of said first, second and third unit cells are floated.

11. The method of claim 7, wherein said erase operation is performed in condition that negative voltage are applied to said first control gate and another terminals of said first, second and third unit cells are floated.

12. The method of claim 7, wherein said program operation is performed in condition that positive bias voltage to said second control gate, and another terminals of said first, second and third unit cells are floated.

* * * * *